(12) United States Patent
Dobbertin et al.

(10) Patent No.: US 8,686,440 B2
(45) Date of Patent: Apr. 1, 2014

(54) ORGANIC LIGHT EMITTING COMPONENT AND ILLUMINATION MEANS COMPRISING A COMPONENT OF THIS TYPE

(75) Inventors: Thomas Dobbertin, Regensburg (DE); Nina Riegel, Tegernheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 558 days.

(21) Appl. No.: 12/995,182

(22) PCT Filed: May 7, 2009

(86) PCT No.: PCT/DE2009/000644
§ 371 (c)(1),
(2), (4) Date: Feb. 17, 2011

(87) PCT Pub. No.: WO2009/143801
PCT Pub. Date: Dec. 3, 2009

(65) Prior Publication Data
US 2011/0266572 A1 Nov. 3, 2011

(30) Foreign Application Priority Data
May 29, 2008 (DE) .......................... 10 2008 025 755

(51) Int. Cl.
*H01L 33/02* (2010.01)
(52) U.S. Cl.
USPC ......................................................... 257/79
(58) Field of Classification Search
USPC ................... 438/22, 26, 34; 257/79, E33.001, 257/E33.044, 40, 103; 313/506
See application file for complete search history.

(56) References Cited

U.S. PATENT DOCUMENTS

| 7,049,757 | B2 | 5/2006 | Foust et al. |
| 7,052,351 | B2 | 5/2006 | Tutt et al. |
| 7,659,544 | B2 * | 2/2010 | Lu et al. .......................... 257/88 |
| 2004/0012026 | A1 | 1/2004 | Seo et al. |
| 2006/0119258 | A1 | 6/2006 | Sakata et al. |
| 2006/0145599 | A1 | 7/2006 | Stegamat et al. |
| 2007/0007882 | A1 | 1/2007 | Fukuoka et al. |

(Continued)

FOREIGN PATENT DOCUMENTS

| CN | 1781340 | 5/2006 |
| CN | 1816230 | 8/2006 |

(Continued)

OTHER PUBLICATIONS

Wang et al., "Alternating-current light-emitting devices based on conjugated polymers." Applied Physics Letters 68, 7 (1996): pp. 894-896.*

(Continued)

*Primary Examiner* — Michele Fan
(74) *Attorney, Agent, or Firm* — Cozen O'Connor

(57) ABSTRACT

In at least one embodiment of the organic light-emitting component (10), the latter comprises a unipolar charge carrier balder layer (3), a first layer (1) and a second layer (2) which are applied to opposing sides of the charge carrier barrier layer (3) and are in each case formed of at least one organic material, and two ambipolar injection layers (4), which are applied to the sides of the first (1) and second layers (2) remote from the charge carrier barrier layer (3). Such an organic, light-emitting component (10) may be operated efficiently with alternating current.

16 Claims, 4 Drawing Sheets

(56) References Cited

U.S. PATENT DOCUMENTS

| | | | |
|---|---|---|---|
| 2007/0075631 A1 | 4/2007 | Tung et al. | |
| 2007/0120136 A1* | 5/2007 | Noda et al. | 257/98 |
| 2007/0152572 A1* | 7/2007 | Kawakami et al. | 313/505 |
| 2007/0176161 A1* | 8/2007 | Seo et al. | 257/13 |
| 2008/0116450 A1* | 5/2008 | Fong et al. | 257/40 |
| 2008/0135835 A1* | 6/2008 | Seo et al. | 257/40 |
| 2010/0314648 A1* | 12/2010 | Fehrer et al. | 257/98 |
| 2012/0187859 A1* | 7/2012 | Wellmann et al. | 315/246 |

FOREIGN PATENT DOCUMENTS

| | | |
|---|---|---|
| CN | 1871877 | 11/2006 |
| DE | 103 24 787 | 2/2004 |
| DE | 101 32 329 | 2/2005 |
| EP | 1 315 208 | 11/2002 |
| EP | 1 388 904 | 2/2004 |
| EP | 1 571 709 | 2/2005 |
| EP | 1 613 132 | 1/2006 |
| EP | 1 667 494 | 6/2006 |
| JP | 2005-259492 | 9/2005 |
| WO | WO 2005/009087 | 1/2005 |
| WO | WO 2006043678 A1 * | 4/2006 |

OTHER PUBLICATIONS

Hwang et al., "Poly(;yridine-2,5-diyl) as electron-transport/hole blocking layer in poly(pheylene vinylene) light-emitting diode." Polymer 40 (1999): pp. 3233-3235.*

Welter et al., "Electroluminescent device with reversible switching between red and green emission" Nature Publishing Group 421, 2 (2003): pp. 54-57.*

Y.Z. Wang et al., "Alternating-Current Light-Emitting Devices Based on Conjugated Polymers", Applied Physics Letters, American Institute of Physics, vol. 68, No. 7, pp. 894-896, Feb. 12, 1996.

S. Welter et al., "Electroluminescent Device with Reversible Switching Between Red and Green Emission", Nature, Nature Publishing Group, vol. 42, No. 6918, Jan. 2, 2003.

M-Y Hwang et al., "Poly(pyridine-2,5-diyl)as electron-transport/hole blocking layer in poly (phenylene vinylene) light-emitting diode", Polymer, Elsevier Science Publishers B.V, vol. 40, No. 11, pp. 3233-3235, May 1, 1999.

* cited by examiner

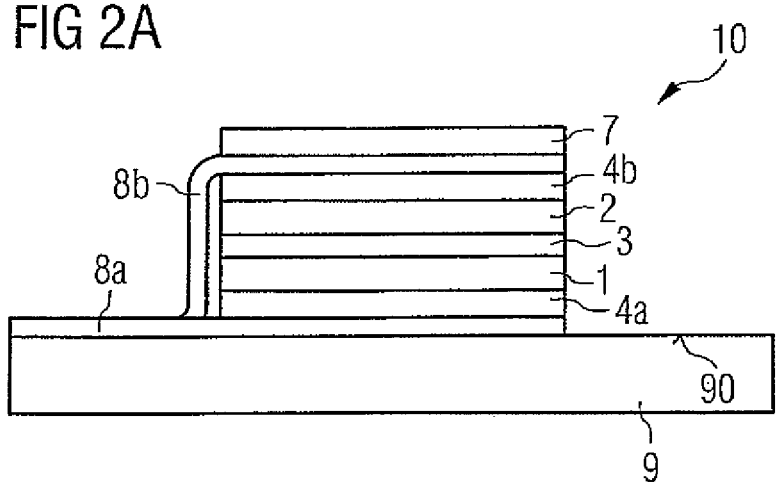
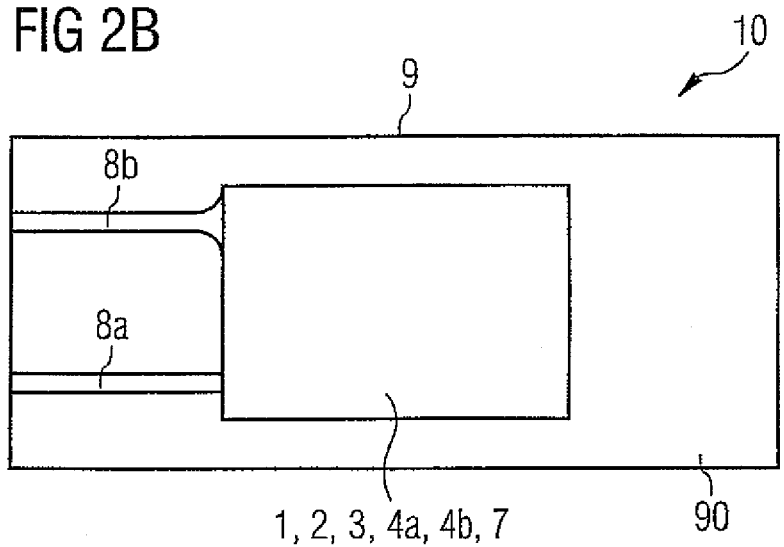

ORGANIC LIGHT EMITTING COMPONENT AND ILLUMINATION MEANS COMPRISING A COMPONENT OF THIS TYPE

RELATED APPLICATIONS

This is a U.S. national stage of application No. PCT/DE2009/000644, filed on May 7, 2009.

This application claims the priority of German application no. 10 2008 025 755.9 filed May 29, 2008, the entire content of which is hereby incorporated by reference.

FIELD OF THE INVENTION

The invention relates to an organic light-emitting component and to a light source with such a component.

BACKGROUND OF THE INVENTION

Semiconductor material-based components emitting or indeed receiving electromagnetic radiation have found widespread industrial application and many uses in everyday life. Common semiconductor materials may be divided roughly into two classes: organic and inorganic semiconductor materials. Organic semiconductor materials may be produced relatively inexpensively and applied comparatively simply to a carrier. Furthermore, organic semiconductor materials offer the possibility, relative to inorganic materials, of providing in principle very large-area, light-emitting or indeed light-receiving arrangements.

Conventional organic- and inorganic-based light-emitting diodes are operated with direct current. However, normal mains networks only supply alternating current. To operate an LED with mains voltage it is therefore necessary to use additional elements, such as for example rectifier circuits. However, the use of direct current makes it impossible or very difficult to exploit the advantages associated with alternating current, such as for example simple voltage transformation.

SUMMARY OF THE INVENTION

An object to be achieved is to provide an organic light-emitting component which may be operated efficiently with alternating current. A further object to be achieved is to provide a light source comprising such a component.

According to at least one embodiment of the organic light-emitting component, the latter comprises a unipolar charge carrier barrier layer, which may in particular be based on organic material. Such a charge carrier barrier layer is understood to be a layer which does not allow one type of charge carrier to pass through or allows such passage only to a very limited extent. Unipolar thus means that the charge carrier barrier layer either severely impairs the mobility of positive or negative charge carriers or prevents the passage thereof through the charge carrier barrier layer, while on the other hand charge carriers of the opposite charge may pass through the charge carrier barrier layer. Negative charge carriers are for example electrons, while positive charge carriers are for example "holes".

According to at least one embodiment of the organic light-emitting component, the latter comprises at least one layer, which is configured to emit light or indeed to receive light when in operation. This layer is formed of at least one organic material. The layer is preferably configured to emit electromagnetic radiation in the ultraviolet, visible and/or near-infrared spectral range when in operation. The organic component preferably emits light in the spectral range between 200 nm and 3000 nm, particularly preferably between 300 nm and 950 nm, very particularly preferably between around 380 nm and 780 nm.

According to at least one embodiment, the organic light-emitting component comprises at least one ambipolar injection layer, which is suitable for injecting both positive and negative charge carriers into the light-emitting layer.

According to at least one embodiment of the organic light-emitting component, the latter comprises at least one electrode. Preferably, the component comprises a first and a second electrode, which are particularly preferably applied to the sides of the ambipolar injection layers remote from the charge carrier barrier layer. The first and/or the second electrode may in each case be of large-area configuration. This enables large-area emission of the electromagnetic radiation generated in an active zone. "Large-area" may mean that the organic, electronic component comprises an area of greater than or equal to a few square millimeters, preferably greater than or equal to a square centimeter and particularly preferably greater than or equal to a square decimeter. Alternatively or additionally, the first and/or the second electrode may be structured at least in subzones. This enables structured emission of the electromagnetic radiation generated in the active zone, for instance in the form of pixels or pictograms.

According to at least one embodiment of the organic component, both electrodes are at least partially transparent. According to at least one other embodiment, one electrode is at least partially transparent while the other electrode is at least partially reflective for the radiation emitted when the component is in operation. Suitable electrode materials are for example transparent conductive oxides, or TCOs for short. As a rule these are metal oxides, such as for example zinc oxide, tin oxide, cadmium oxide, titanium oxide, indium oxide or indium-tin oxide, which is also known as ITO. In addition to binary metal-oxygen compounds, such as for example the above-stated metal oxides, tertiary metal-oxygen compounds, such as for example $Zn_2SnO_4$, or mixtures of different, transparent conductive oxides also belong to the group of TCOs. Metals are also suitable for the electrodes, such as for example aluminium, barium, indium, silver, gold, magnesium, calcium or lithium as well as compounds, combinations or alloys thereof. Likewise, the electrodes may be formed at least in part of an organic material. The electrodes may also be configured such that those parts of the electrodes which are in direct contact with an injection layer, for example, are formed of a different material from the remaining parts of the electrodes.

One or indeed a plurality of the organic functional layers, such as for example the charge carrier barrier layer, the injection layers, the electrodes or the layers which emit light when the component is in operation may comprise organic polymers, organic oligomers, organic monomers, small organic, non-polymeric molecules, known as "small molecules", or combinations thereof. It may in particular be advantageous for the organic radiation-emitting layer sequence to comprise a functional layer, which takes the form of a hole transport layer, in order for example to allow effective hole injection into a for example electroluminescent layer or an electroluminescent zone. Materials which may prove advantageous for a hole transport layer are for example tertiary amines, carbazole derivatives, conductive polyaniline or polyethylenedioxythiophene. Furthermore, it may be advantageous for the functional layer to take the form of an electroluminescent layer. Materials suitable for this purpose are those which comprise radiation emission based on fluorescence or phosphorescence, for example polyfluorene, polythiophene or polyphenylene, or derivatives, compounds, mixtures or copolymers thereof.

In at least one embodiment of the organic light-emitting component, the latter comprises a unipolar charge carrier barrier layer, a first layer and a second layer which are applied to opposing sides of the charge carrier barrier layer and are in each case formed of at least one organic material, and two ambipolar injection layers, which are applied to the sides of the first and second layers remote from the charge carrier barrier layer.

Such an organic, light-emitting component may be operated efficiently with alternating current. Since operation with alternating voltage does not result in the formation of any long-lived space-charge regions in the organic light-emitting component and moreover the diffusion of ions within the component is suppressed by alternating current operation, the service life of the organic light-emitting component is additionally increased.

According to at least one embodiment of the organic light-emitting component, the latter comprises an alternating current control unit. Such a control unit may for example be formed of a transformer, which converts the mains voltage into an alternating voltage with relatively low effective voltage. Furthermore, the control unit may fulfil a current-and/or voltage-limiting function. The control unit is in particular not a direct current source. Such a control unit may prevent the organic light-emitting component from being destroyed when in operation by excessively high currents or excessively high voltages.

According to at least one embodiment of the component, in which the latter is provided with an alternating current control unit, at least one of the parameters amplitudes, amplitude ratio or pulse-duty factor of the alternating current is controlled by means of this control unit. Alternating current has by definition a phase of positive voltage and a phase of negative voltage. Amplitudes should be understood to be effective voltages of the positive and negative phase. Amplitude ratio is understood to mean the ratio of the effective voltages of positive and negative phase. The pulse-duty factor is defined as the ratio of duration of the phase with positive voltage and the duration of positive and negative phase together.

In particular, all the variables amplitudes, amplitude ratio and pulse-duty factor may be controlled mutually independently by means of the control unit. Preferably, the control unit may also convert the sinusoidal alternating voltage from the conventional mains network into other voltage forms, for example into a square-wave voltage. The power supply of the first layer and second layers may be variably adjusted by means of such a control unit and the options for configuring the light spectrum emitted when the organic component is in operation are increased thereby.

According to at least one embodiment of the component, the control unit for the alternating current is at least in part organic. Organic does not here mean that parts which are non-essential to functioning, such as the housing of the control unit or insulating materials for electrical lines consist of organic materials such as plastics. What is meant is that components essential to functioning, such as for instance amplifier circuits or sensors, are based at least in part on organic materials. Such a control unit makes it possible for the light-emitting layers and the control unit itself to be produced by the same, organic material-based technology. This may reduce manufacturing costs. In addition, if suitable organic materials are selected, the control unit may at least in part be transparent and/or be applied to the same carrier as the light-emitting layers.

According to at least one embodiment of the component, the first and second layers emit light alternately during component operation. This means that the recombination of positive and negative charge carriers takes place alternately in the first and second layers. Since the charge carrier barrier layer may for example prevent positive charge carriers from passing through this barrier layer, the positive charge carriers accumulate, as a function of the prevailing phase of the alternating voltage, in either the first or the second layer. Since negative charge carriers such as electrons may penetrate a charge carrier barrier layer configured in this way, they may pass through both first and second layer irrespective of the prevailing phase. This means that, in this case, the layer which emits light is in each case the layer which is connected to the anode.

If the component is operated for example with an alternating voltage with a frequency of 50 Hz, as is usual for the conventional mains network, the component may emit light at 100 Hz, since the first and second layers emit light alternately at 50 Hz. At such high frequencies the human eye can no longer perceive flicker and the component is suitable for example as a light source for the purposes of general lighting. Since, moreover, light is emitted both in the phase with negative and in the phase with positive voltage, the operating voltage or the operating current may be approximately halved while maintaining an identical emitted light output, relative to a conventional organic or inorganic light-emitting diode operated with alternating voltage, which emits light only during the negative phase for example. By reducing operating current or voltage, the service life of the organic component is increased.

According to at least one embodiment of the organic light-emitting component, the charge carrier barrier layer is continuous and unstructured, i.e. the charge carrier barrier layer has the same thickness and material composition between the first and second layers at least within the bounds of conventional manufacturing tolerances. This means in particular that the first and second light-emitting layers are not at any point in direct contact with one another. Such a continuous, unstructured layer may be particularly efficiently applied. Such a layer may reduce manufacturing costs.

According to at least one embodiment of the organic light-emitting component, the first and second layers are configured such that they emit light within various wavelength ranges when the component is in operation. The wavelengths emitted by the first and second layers may, however, partially overlap. Preferably, one of the two layers emits light in the blue or UV spectral range and the other layer emits light in the green or red spectral range. The colour configuration or the entire spectrum of the light emitted by the organic component may be adjusted in many different ways by means of layers emitting in different colours.

According to at least one embodiment of the organic light-emitting component, at least one of the parameters hue, saturation and lightness may be controlled by means of the control unit for alternating voltage. Preferably, all three of the stated parameters may be mutually independently controlled by means of the control unit. The emission characteristics of the component may be purposefully adjusted by means of such a control unit.

According to at least one embodiment of the organic light-emitting component, the latter comprises at least one sensor. The sensor may take the form of a photodiode. Preferably, the sensor is based at least in part on organic materials. By way of the sensor and the alternating current control unit, the light emitted from the spectrum of the component when in operation may for instance be automatically adjusted.

According to at least one embodiment of the organic light-emitting component, at least one conversion medium is applied over a side, remote from the charge carrier barrier layer, of the first and/or second layers, which conversion medium converts at least part of the radiation emitted by the first and second layers when in operation into radiation of a different frequency. The conversion medium is preferably applied over only one of the two layers. However, if the conversion medium is applied over both layers, the conversion medium in this case preferably converts only radiation from one of the two layers. The conversion medium may for example take the form of an organic or inorganic luminescent dye. The conversion medium preferably converts only part of the radiation emitted for example by the first layer, so resulting in a polychromatically emitting component. Such a component may vary widely with regard to the spectral characteristic of the emitted light.

According to at least one embodiment of the organic light-emitting component, the latter comprises at least one substrate with at least one mounting side, wherein the first layer emitting light during operation, the charge carrier barrier layer, the second layer emitting light during operation and the ambipolar injection layers are applied over the mounting side. The substrate is here at least partially transmissive for the light emitted when the component is in operation. Such an at least partially transparent or translucent substrate makes it possible to achieve an arrangement emitting on both sides of the component. It is likewise possible in this way to obtain a component which is transmissive at least partially and at least in specific parts of the visible spectral range.

According to at least one embodiment of the organic light-emitting component, the substrate thereof is configured to be at least partially reflective. The substrate may thus serve as a reflector for the light emitted during operation. Such a substrate allows the obtainment of an organic component which emits light at high intensity on just one side.

According to at least one embodiment of the organic light-emitting component, the substrate thereof comprises structuring for instance in the form of recesses, wells or indentations, in which the various organic layers of the component are mounted. The recess may offer protection to the various organic layers or indeed take the form of a reflector. It is also possible for structuring to be applied to the substrate for example to improve light outcoupling. Lenticular structures, such as for instance Fresnel lenses, may be produced.

According to at least one embodiment of the organic light-emitting component, the latter comprises at least one top plate. The top plate may consist of the same material as the substrate or of another material. Possible materials of which substrate and/or top plate may consist are glasses, quartzes, plastics films, metals, metal foils, TCOs, silicon wafers or other suitable semiconductor materials. Composite materials may also be used. Electrical conductors are preferably applied to the substrate and/or top plate, which may serve in electrical contacting of the organic component. Substrate and/or top plate are particularly preferably formed from soda-lime glass or window glass. Substrate and top plate preferably consist of the same material and/or have the same physical and chemical characteristics. By using such materials, the organic component may be produced cost-efficiently and the mechanical or chemical properties thereof adjusted purposefully.

According to at least one embodiment of the organic light-emitting component, the substrate and/or the top plate comprises(s) an adhesion-promoting layer, by means of which the component may be attached for instance to an external carrier. The adhesion-promoting layer may be formed by adhesive microstructuring or by an adhesive layer. Electrical connections for contacting the component are preferably passed outwards in such a way that, by way of mechanical attachment of the component, electrical contacting thereof is achieved at the same time.

According to at least one embodiment of the organic light-emitting component, substrate and top plate are bonded together mechanically via a bonding agent. The bonding agent preferably additionally isolates the organic layers relative to environmental influences such as moisture and oxygen. The bonding agent preferably comprises a glass solder, glass frits, a resin or a metal. The bonding agent particularly preferably has a markedly lower melting point than the substrate and/or the top plate. The bonding agent is likewise preferably meltable, softenable or curable by means of electromagnetic radiation or electromagnetic fields. A long-lived organic component may be produced by means of such a bonding agent.

According to at least one embodiment of the organic light-emitting component, at least one admixture is added to the substrate and/or the top plate and/or the bonding agent. The admixture takes the form, for example, of a filter medium, a conversion medium, a diffusion or scattering medium or a reflection medium. The admixture may also allow adaptation of the coefficients of thermal expansion for instance of the bonding agent and the substrate. By means of such admixtures, the physical and chemical characteristics of the substrate, the top plate and/or the bonding agent may be purposefully adjusted over a wide range.

According to at least one embodiment of the organic light-emitting component, the latter comprises absorber materials or getters, which bind substances harmful to the organic layers. In particular, the absorber material may bind moisture and oxygen. The absorber material may envelop the organic layers or be applied between substrate and top plate and surround the active layers for example annularly or in the manner of a frame. By using an absorber material, the service life of the component may be increased.

According to at least one embodiment of the organic light-emitting component, the latter comprises spacers or spacer particles, by means of which the distance between substrate and top plate is adjusted. The use of spacers may simplify production of the component.

According to at least one embodiment of the organic light-emitting component, the latter is configured to be at least partially transparent. This may mean in particular that the various organic layers and the electrodes are formed from materials which are transmissive in the visible spectral range or at least in part of this spectral range. The component may likewise also, for instance, be transparent merely in a specific visible spectral range, so resulting in a coloured component. Moreover, the component may comprise structuring, such that different areas of the component are of different colours or different transparent regions alternate. By way of a transparent component, it is possible for example to achieve a transparent light source, for instance in conjunction with windows.

According to at least one embodiment of the organic light-emitting component, the latter emits red, green and blue light when in operation. The component constitutes an "RGB unit". Such an organic component may emit white light and is suitable for example for general lighting purposes.

The invention further relates to a light source. According to at least one embodiment of the light source, the latter comprises at least one component which may be configured for example according to one or more of the above-stated embodiments. In addition, the light source comprises at least one alternating current control unit. Preferably, the light source comprises a plurality of components, which may be arranged two- or three-dimensionally. The light source may also comprise various groups of components, wherein the individual groups in each case emit light of a different colour, for instance, and are controlled by separate control units, for example. Such a light source may be operated with alternating current and may be of large-area configuration.

According to at least one embodiment of the light source, the latter comprises at least one component with control unit, wherein the control unit to be assigned to the component is a component part of the component. The control unit is then preferably applied at least in part to the same substrate as the organic layers of the component. The light source preferably comprises a further control unit separated from the at least one component. Separated here means for instance that the control unit and the component are mounted on different carriers, or that for example a mechanically flexibly configured electrical conductor connects the component and the control unit. This separate control unit may take the form of a mains transformer, which transforms the mains voltage to a lower alternating voltage. Adjustment of the colour is then possible, for instance, by means of the control unit to be assigned to at least one component. In an alternative embodiment, the light source overall comprises a single control unit separated from the at least one component.

BRIEF DESCRIPTION OF THE DRAWINGS

The organic light-emitting component described here is explained in greater detail below with reference to exemplary embodiments and the associated figures.

In the drawings:

FIG. 2 shows a schematic side view a and a schematic plan view b of one exemplary embodiment of an organic component with a substrate.

DETAILED DESCRIPTION OF THE DRAWINGS

Figure 1A:
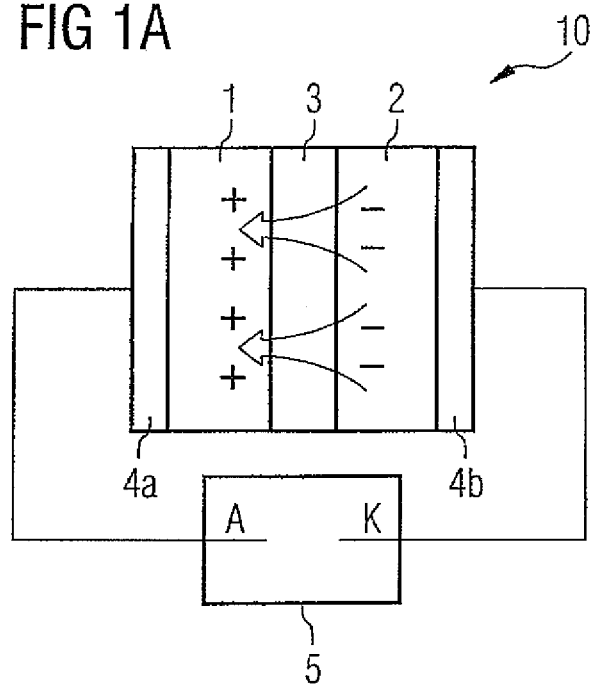
FIGS. 1A, 1B show schematic side views of an exemplary embodiment of an organic component to explain operation with alternating current.

In the exemplary embodiments and figures, identical or identically acting components are in each case provided with the same reference numerals. The elements shown should not be considered to be true to scale, but rather individual elements may be shown exaggeratedly large to assist in understanding. This applies in particular to the layer thicknesses of the individual organic layers.

Figure 1B:
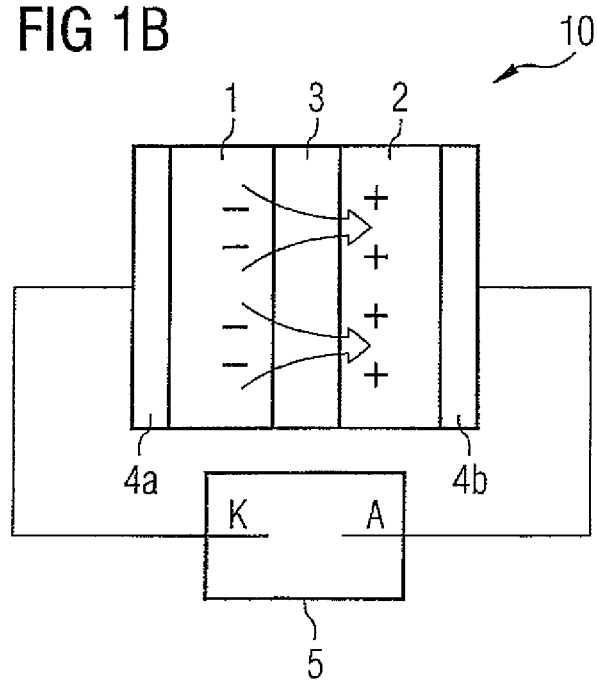

FIG. 1 shows an exemplary embodiment of an organic light-emitting component 10. The organic component 10 is operated with alternating current. FIGS. 1A and 1B show the electrical configuration during the positive and negative phases respectively of the alternating current.

The organic light-emitting component 10 is constructed as follows: A charge carrier barrier layer 3 is mounted in the middle of the component 10. This charge carrier barrier layer 3 is configured such that it may be penetrated for example by negative charge carriers, such as electrons, symbolized by "−". Positive charge carriers, such as "holes", symbolized by "+", cannot however pass through the charge carrier barrier layer 3 or only to a very limited extent. Over its entire extent, the charge carrier barrier layer 3 comprises the same material composition and the same thickness within the bounds of manufacturing tolerances. A charge carrier barrier layer is disclosed for example in publication U.S. Pat. No. 7,052,351 B2, whose disclosure content relating to the charge carrier barrier layer is included by reference.

A first layer 1 and a second layer 2 are applied to the two main sides of the charge carrier barrier layer 3, which first and second layers are configured to emit electromagnetic radiation when the component 10 is in operation. First layer 1 and second layer 2 are in each case made of at least one organic material. Suitable organic materials are described for instance in publication US 2006/0145599A1, whose disclosure content relating to the organic light-emitting layers described therein is hereby included by reference.

Ambipolar injection layers 4a, 4b are applied to the sides of the first layer 1 and second layer 2 remote from the charge carrier barrier layer 3. The ambipolar injection layers 4a, 4b are configured such that both positive + and negative − charge carriers may respectively be injected into the first layer 1 and second layer 2 by the ambipolar injection layers 4a, 4b. The injection layers 4a, 4b are connected electrically to a control unit 5.

Ambipolar charge carrier injection layers may be produced in various ways. Hole- and electron-conducting materials may be simultaneously vapour-deposited, for example, to produce such a layer. It is likewise possible for a gradient of electron-conducting dopants to be produced for example in a hole-conducting matrix by means of vapour deposition for example. The same applies to hole-conducting dopants in an electron-conducting matrix.

Alternatively, an ambipolar material may be produced in that such a material is produced by the aggregation of highly concentrated dopants. Furthermore, an ambipolar injection layer may be formed by coevaporation of a matrix of various low band gap materials with different absolute HOMO levels, such that gradual or stepwise injection of positive and negative charge carriers into the light-emitting layers is possible. A further option is to use intrinsically ambipolar materials. Such materials are indicated for example in publication US 2007/0075631 A1, whose disclosure content relating to the ambipolar injection layers is included by reference.

FIG. 1A shows the electrical configuration during the positive phase of the alternating current. During the positive phase, the ambipolar injection layer 4a is connected electrically to an anode A of the control unit 5. The injection layer 4b is connected electrically conductively to a cathode K of the control unit 5. Since a positive voltage prevails at the injection layer 4a, positive charge carriers + are injected by the injection layer 4a into the first layer 1. These positive charge carriers +are driven out of the injection layer 4a towards the charge carrier barrier layer 3 as a result of the prevailing positive voltage. Since the charge carrier barrier layer 3 does not transmit positive charge carriers +, these are retained in the region upstream of the charge carrier barrier layer 3. The negative charge carriers − injected into the second layer 2 via the cathode K or the injection layer 4b, which negative charge carriers − are driven towards the first layer 1 by the injection layer 4b, are however able to pass through the charge carrier barrier layer 3 and so arrive in the first layer 1. In the first layer 1 positive + and negative − charge carriers are thus recombined. During the positive phase of the alternating voltage electromagnetic radiation is thus emitted by the first layer 1.

FIG. 1B shows the electrical configuration during the negative phase of the alternating voltage. Anode A and cathode K are thus reversed relative to FIG. 1A. The positive charge carriers + are injected by the injection layer 4b into the second layer 2 and retained by the charge carrier barrier layer 3. The negative charge carriers − injected via injection layer 4a pass through first layer 1 and charge carrier barrier layer 3, whereby charge carrier recombination takes place in the second layer 2 and the latter emits light. The first layer 1 and second layer 2 thus alternately emit electromagnetic radiation as a function of the voltage prevailing at that moment.

According to the exemplary embodiment as shown in FIG. 2, the organic layers 1, 2, 3, 4a, 4b are applied over a mounting side 90 of a substrate 9. The mounting side 90 is of planar construction, such that the various organic layers may be applied to the mounting side 90. Starting from the mounting side 90, the following layers are mounted on the substrate 9: first electrode 8a, first ambipolar injection layer 4a, first layer 1, charge carrier barrier layer 3, second layer 2, second ambipolar injection layer 4b, second electrode 8b and a conversion medium layer 7. The mode of operation and structure of the organic layers correspond to the exemplary embodiment according to FIG. 1.

The electrodes 8a and 8b are applied over the entire surface on the sides of the injection layers 4a, 4b remote from the charge carrier barrier layer 3. The electrode 8b located on the side of the layer stack remote from the substrate 9 extends to the mounting side 90 of the substrate 9 in such a way that no undesirable electrical connections to layers other than the injection layer 4b arise. The electrode 8b is transmissive for the radiation emitted during operation by the first layer 1 and second layer 2. First layer 1 and second layer 2 here emit in different spectral ranges. The conversion medium 7 converts only part of the radiation emitted for example by the second layer 2, such that overall a polychromatically emitting component 10 is obtained, which may emit for instance white light. The electrode 8a is reflective for radiation emitted by the component 10. The electrodes 8a, 8b extend laterally away from the layer stack 1, 2, 3, 4a, 4b along narrow tracks on the mounting side 90, as is visible in FIG. 2b.

Figure 3:
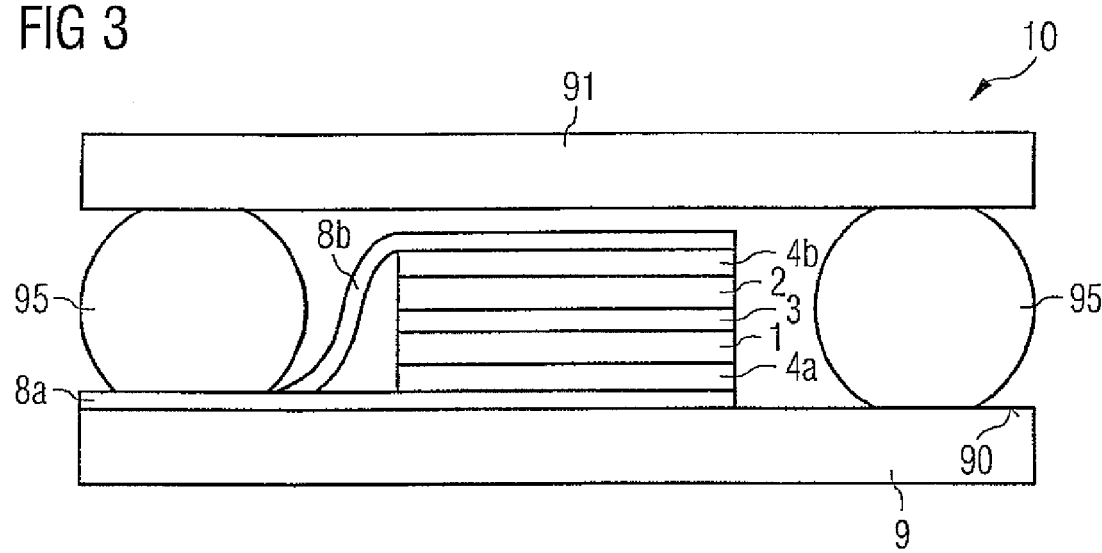
FIG. 3 is a schematic sectional representation of an exemplary embodiment of an organic component with a top plate.

In the exemplary embodiment according to FIG. 3 the component 10 also comprises a top plate 91 in addition to the substrate 9. Substrate 9 and top plate 91, which are formed for example from a soda-lime glass and are of planar configuration, are bonded mechanically together with a bonding agent 95. The bonding agent 95 takes the form of glass solder. The organic layers 1, 2, 3, 4a, 4b are additionally enclosed by way of the bonding agent 95, substrate 9 and top plate 91. The first layer 1 and the second layer 2 here emit light in the same spectral range. The substrate 9 and the top plate 91 are transmissive for radiation emitted during operation by the first layer 1 and the second layer 2, as is the bonding agent 95.

The layer sequence of the organic layers 1, 2, 3, 4a, 4b corresponds to the exemplary embodiment shown in FIG. 2, wherein in the exemplary embodiment according to FIG. 3 the electrode 8a is likewise transparent for emitted radiation, so resulting in a component 10 transparent in at least parts of the visible spectral range.

Figure 4:
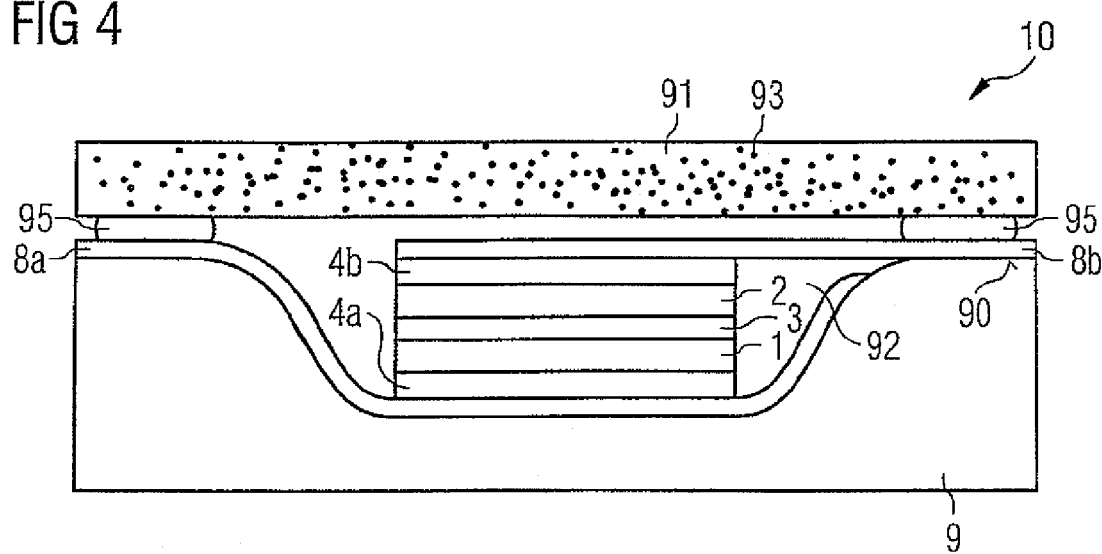
FIG. 4 shows a schematic sectional representation of an exemplary embodiment of an organic component with a substrate with a recess.

In the exemplary embodiment according to FIG. 4, the substrate 9 comprises a recess 92, in which the organic layers 1, 2, 3, 4a, 4b are mounted. The electrode 8a is applied flat to the mounting side 90 in the recess 92 and in this way forms a reflector for radiation emitted by the component 10. The substrate 9 may be formed of a glass or a plastics film. The recess 92 may be produced simply and cost-efficiently using a punching or embossing process. Because the active layers are located in the recess 92, the top plate 91 may be of planar configuration. In this way, the height or extent of the bonding agent 95 between top plate 91 and substrate 9 may be reduced significantly, such that the lateral extent of the bonding agent 95 is substantially greater than the vertical extent thereof. In this way, particularly tight enclosure of the organic layers may be achieved, since the outer surface of the bonding agent 95 remote from the layer stack 1, 2, 3, 4a, 4b is only very small. The quantity of bonding agent 95, which moisture or oxygen for instance have to overcome laterally by diffusion before such substances reach the organic layer stack 1, 2, 3, 4a, 4b is however relatively large.

An admixture in the form of a reflection medium, diffusion medium, conversion medium, filter medium or a substance for adjusting the coefficients of thermal expansion may optionally be added to the top plate 91 or indeed to the substrate 9. Alternatively, it is likewise possible, for example, for the electrode 8b to be reflective and the electrode 8a transparent for the radiation emitted by the component 10. The recess 92 may then for example take the form of a lens, in order to emit the light emitted by the first layer 1 and second layer 2 approximately uniformly over a relatively large angular range. As a further option it is possible for a layer to be mounted between mounting side 90 and electrode 8a, which layer for example allows adaptation of the refractive index of organic layers 1, 2, 3, 4a, 4b and substrate 9 or indeed represents a planarisation of those regions of the recess 92 on which the various organic layers 1, 2, 3, 4a, 4b or the electrode 8a are applied. Such a planarisation layer simplifies the production process of the component 10. Furthermore, it is possible for an absorber material or a getter to be mounted in the recess 92, which for example envelops the organic layers 1, 2, 3, 4a, 4b or indeed the substrate 9 and the top plate 91. As a further option the substrate 9 and/or the top plate 91 may comprise a structuring, which for example improves light outcoupling from the component 10.

Figure 5:
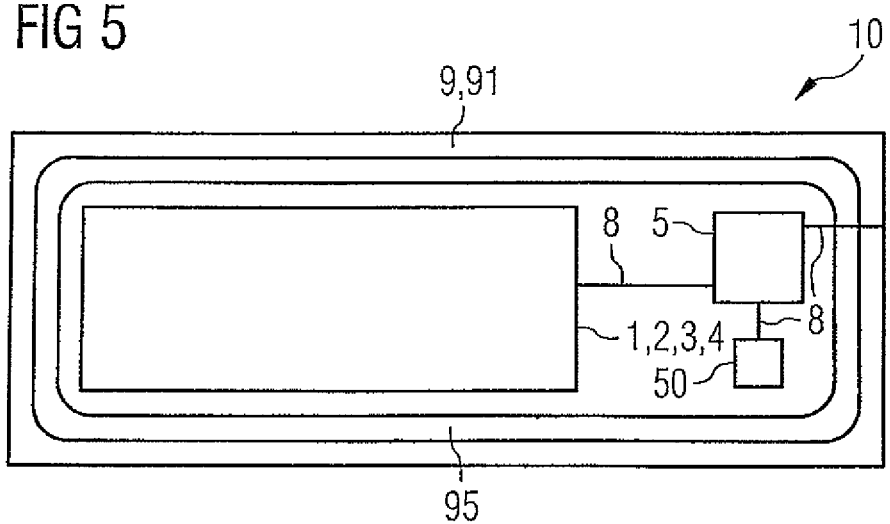
FIG. 5 is a schematic plan view of an exemplary embodiment of an organic component with a control unit mounted on a substrate.

In the exemplary embodiment according to FIG. 5, an organic light-emitting component 10 is shown, which comprises, in addition to the layer stack 1, 2, 3, 4, a control unit 5 applied between the substrate 9 and the top plate 91 and a sensor 50 likewise located between the top plate 91 and the substrate 9. The layer stack 1, 2, 3, 4, the control unit 5 and the sensor 50 are surrounded in the manner of a frame by a bonding agent 95, which bonds the substrate 9 and the top plate 91 together. The electrodes 8 produce an electrical connection from outside the bonding agent 95 to the inner region and between the individual components. The organic layers 1, 2, 3, 4 are applied over a large area of the substrate 9 and occupy the majority of the area of the substrate 9. By means of the sensor 50, which may also be based on organic materials, the lightness or hue and saturation of the light emitted by the organic layers 1, 2, 3, 4 when in operation may be measured and adjusted by way of the control unit 5. The control unit 5 may likewise be based at least partially on organic materials and mounted wholly or indeed only in part within the frame formed by the bonding agent 95 on the substrate 9.

It is optionally possible for a plurality of layer stacks 1, 2, 3, 4 also emitting in different colours to be applied to the substrate 9. One control unit 5 and one sensor 50 may be used per layer stack 1, 2, 3, 4. However, a plurality of layer stacks 1, 2, 3, 4 may also be controlled by way of a single control unit 5.

Figure 6A:
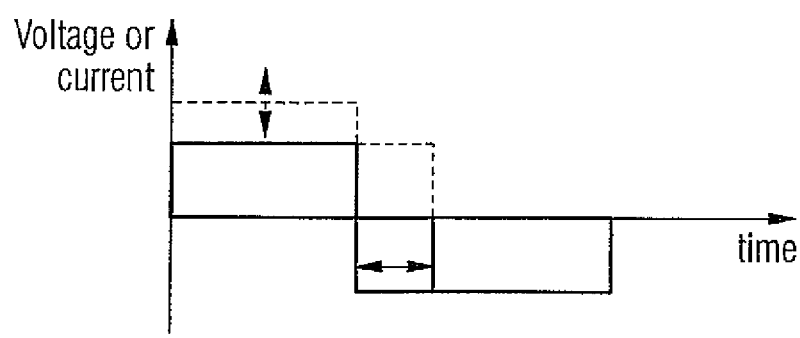
FIGS. 6A, 6B show a schematic explanation of alternating current activation of an organic component.
Figure 6B:
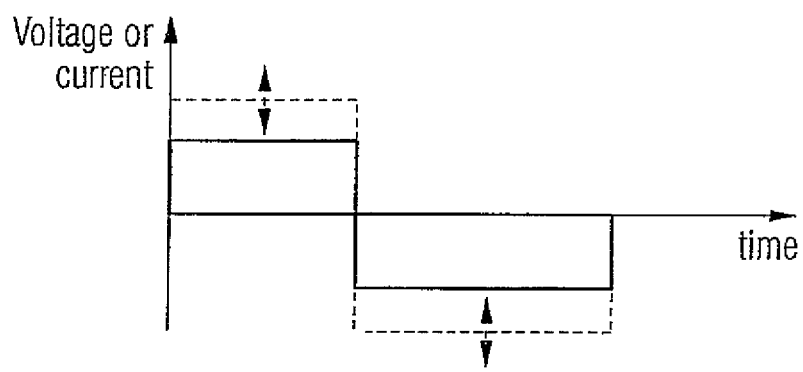

FIG. 6 shows a control diagram for the alternating current control unit 5. As shown in FIG. 6B, positive and negative phases have different durations. The voltage profile corresponds to a square-wave voltage, but may likewise be sinusoidal. By modifying the effective voltages, the lightness of the light emitted by the component 10 may be adjusted.

Adjustment of hue and saturation is explained in FIG. 6A. If the control unit 5 is used to change the pulse-duty factor, i.e. the ratio of the duration of the positive phase and of the entire period of oscillation and alternatively or in addition to adjust the effective voltage of the positive and/or negative phase, the hue and saturation of the light emitted by the organic component 10 may be controlled. This is the case in particular if the first layer 1 and second layer 2 are configured such that they emit light in different spectral ranges when in operation. The control unit 5 may preferably purposefully control both lightness as well as hue and saturation mutually independently, for example with the assistance of a sensor 50, as shown in the exemplary embodiment according to FIG. 5.

The invention described herein is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:

1. An organic light-emitting component comprising:
   a unipolar charge carrier barrier layer;
   a first layer and a second layer, which are applied to opposing sides of the unipolar charge carrier barrier layer and are in each case formed with at least one organic material and which emit radiation when in operation;
   two ambipolar injection layers, which are applied to sides of the first layer and the second layer remote from the unipolar charge carrier barrier layer; and
   a first and second electrode, applied to sides of the ambipolar injection layers remote from the unipolar charge carrier barrier layer,
   wherein the organic light-emitting component operates with alternating current.

2. The component according to claim 1, further comprising an alternating current control unit.

3. The component according to claim 2, wherein the alternating control unit controls at least one of the parameters amplitudes, amplitude ratio and pulse-duty factor of the alternating current.

4. The component according to claim 1, wherein the first layer and the second layer alternately emit light when in operation.

5. The component according to claim 1, wherein the unipolar charge carrier barrier layer is continuous and unstructured.

6. The component according to claim 1, wherein the first layer and the second layer are configured so as to emit light in mutually different wavelength ranges when in operation.

7. The component according to claim 3, wherein the control unit controls at least one of parameters hue, saturation and lightness of the light emitted when in operation.

8. The component according to claim 1, wherein a conversion medium is applied over the side of the first layer remote from the unipolar charge carrier barrier layer or the side of the second layer remote from the unipolar charge carrier barrier layer, said conversion medium converts at least part of the radiation emitted when in operation into radiation of a different frequency.

9. The component according to claim 1, comprising a substrate with a mounting side, on which the first layer, the unipolar charge carrier barrier layer and the second layer as well as the ambipolar injection layers are applied, wherein the substrate is at least partially transmissive for light emitted when in operation.

10. The component according to claim 1, comprising a substrate with a mounting side, on which the first layer, the unipolar charge carrier barrier layer and the second layer as well as the ambipolar injection layers are applied, wherein the substrate is at least partially reflective for light emitted when in operation.

11. The component according to claim 9, wherein the substrate contains at least one admixture in the form of a conversion medium, reflection medium, scattering medium or filter medium.

12. The component according to claim 1, wherein the organic light-emitting component is at least partially transparent.

13. The component according to claim 1, wherein the organic light-emitting component emits red, green and blue light when in operation.

14. A light source comprising:
    at least one organic light-emitting component according to claim 1; and
    at least one alternating current control unit.

15. An organic light-emitting component comprising:
    a unipolar charge carrier barrier layer which is a hole blocking layer;
    a first layer and a second layer, which are applied to opposing sides of the unipolar charge carrier barrier layer and are in each case formed with at least one organic material and which emit radiation when in operation;
    two ambipolar injection layers, which are applied to sides of the first layer and the second layer remote from the unipolar charge carrier barrier layer;
    a first and a second electrode, which are applied directly to sides of the ambipolar injection layers remote from the unipolar charge carrier barrier layer; and
    an alternating current control unit,
    wherein the organic light-emitting component operates with alternating current, and
    wherein the first layer and the second layer alternately emit light when in operation.

16. The component according to claim 15, wherein the first electrode, one of the ambipolar injection layers, the first layer, the unipolar charge carrier barrier layer, the second layer, the other ambipolar injection layer, and the second electrode are directly arranged onto each other in this sequence.

* * * * *